(12) United States Patent
Afentakis

(10) Patent No.: US 11,635,336 B2
(45) Date of Patent: Apr. 25, 2023

(54) SENSING PHYSICAL ATTRIBUTES

(71) Applicant: Peratech Holdco Ltd., Richmond (GB)

(72) Inventor: Themistoklis Afentakis, Camas, WA (US)

(73) Assignee: Peratech Holdco Ltd., Richmond (GB)

( * ) Notice: Subject to any disclaimer, the term of this patent is extended or adjusted under 35 U.S.C. 154(b) by 263 days.

(21) Appl. No.: 17/046,548

(22) PCT Filed: Apr. 10, 2019

(86) PCT No.: PCT/GB2019/000058
§ 371 (c)(1),
(2) Date: Oct. 9, 2020

(87) PCT Pub. No.: WO2019/197794
PCT Pub. Date: Oct. 17, 2019

(65) Prior Publication Data
US 2021/0131887 A1 May 6, 2021

Related U.S. Application Data

(60) Provisional application No. 62/657,067, filed on Apr. 13, 2018.

(30) Foreign Application Priority Data

Sep. 12, 2018 (GB) ..................................... 1814821

(51) Int. Cl.
| | | |
|---|---|---|
| *G01L 1/00* | (2006.01) | |
| *G01L 1/22* | (2006.01) | |
| *G01L 1/20* | (2006.01) | |
| *H03K 17/96* | (2006.01) | |

(52) U.S. Cl.
CPC ............ *G01L 1/2287* (2013.01); *G01L 1/205* (2013.01); *G01L 1/2268* (2013.01); *H03K 17/9645* (2013.01); *H03K 2017/9602* (2013.01)

(58) Field of Classification Search
CPC ..... G01L 1/2287; G01L 1/205; G01L 1/2268; H03K 17/9645; H03K 2017/9602
See application file for complete search history.

(56) References Cited

U.S. PATENT DOCUMENTS

| | | | | |
|---|---|---|---|---|
| 2003/0091200 A1* | 5/2003 | Pompei | .................. | B82Y 10/00 381/77 |
| 2013/0147728 A1* | 6/2013 | Lee | ........................ | G06F 3/0416 361/679.01 |
| 2015/0234500 A1* | 8/2015 | Ishino | ................... | G06F 3/0445 216/6 |

(Continued)

FOREIGN PATENT DOCUMENTS

| | | |
|---|---|---|
| EP | 3070464 A1 | 9/2016 |
| WO | 2013/182633 A1 | 12/2012 |

*Primary Examiner* — Max H Noori
(74) *Attorney, Agent, or Firm* — Richard M. Goldberg

(57) ABSTRACT

An apparatus for sensing a physical attribute is shown, that includes a first track (511) defining a first electrode on a substrate (512), a second track (513) defining a second electrode on said substrate and an active film (514) in cooperation with a first sensor portion (516) of the first electrode and a second sensor portion (517) of the second electrode. The second electrode includes a first extended portion (517) to establish a first additional resistance not cooperating with the active film.

20 Claims, 8 Drawing Sheets

(56) References Cited

U.S. PATENT DOCUMENTS

| | | | | |
|---|---|---|---|---|
| 2016/0153845 A1* | 6/2016 | Kawamura | ............ | H01L 41/25 29/25.35 |
| 2017/0179365 A1* | 6/2017 | Yonemura | ............ | B06B 1/0622 |
| 2018/0196561 A1* | 7/2018 | Kim | ............ | G06F 3/0412 |
| 2019/0092016 A1* | 3/2019 | Asaoka | ............ | B41J 2/14274 |

* cited by examiner

SENSING PHYSICAL ATTRIBUTES

CROSS REFERENCE TO RELATED APPLICATIONS

This application claims priority from U.S. Provisional Patent Application No. 62/657,067, filed on 13 Apr. 2018 and United Kingdom Patent Application number 18 14 821.3 the whole contents of which are incorporated herein by reference.

BACKGROUND OF THE INVENTION

The present invention relates to an apparatus for sensing a physical attribute, and a method of constructing an apparatus for sensing a physical attribute.

It is known to provide force/pressure sensors that include tracks for defining electrodes having sensor portions and an active film cooperating with the sensor portions. Characteristics of such devices can be predicted but external components are required in order to measure changes in resistivity.

BRIEF SUMMARY OF THE INVENTION

According to a first aspect of the present invention, there is provided an apparatus for sensing a physical attribute, comprising: a first track defining a first electrode on a substrate; a second track defining a second electrode on said substrate; and an active film in cooperation with a first sensor portion of said first electrode and a second sensor portion of said second electrode, wherein: said second electrode includes a first extended portion to establish a first additional resistance not cooperating with said active film.

According to a second aspect of the present invention, there is provided a method of constructing an apparatus for sensing a physical attribute, comprising the steps of: defining a first electrode on a substrate; further defining a second electrode on said substrate; arranging an active film to cooperate with a first sensor portion of said first electrode and a second sensor portion of said second electrode; and establishing a first additional resistance in an extended portion of said first electrode.

According to a third aspect of the present invention, there is provided a method of sensing a physical attribute, comprising the steps of: exposing a sensor portion of cooperating electrodes to said physical attribute, in which variable current flows through said cooperating electrodes; and measuring a voltage with respect to a reference resistance, wherein said reference resistance is established as a first additional resistance in one of said cooperating electrodes.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art.

Components and processes distinguished by ordinal phrases such as "first" and "second" do not necessarily define an order or a ranking of any sort.

DETAILED DESCRIPTION OF EMBODIMENTS OF THE INVENTION

FIG. 1

Figure 1:
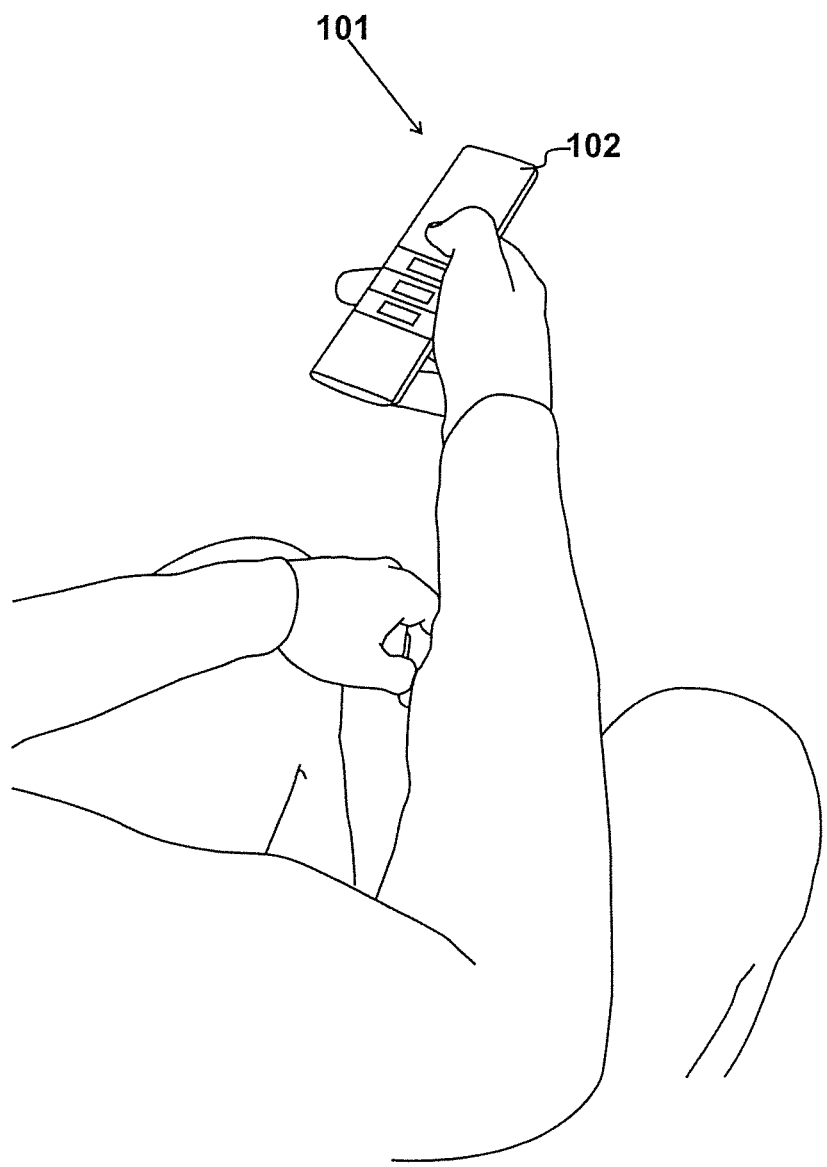
FIG. 1 shows an apparatus for sensing a physical attribute.

An apparatus 101 for sensing a physical attribute is shown in FIG. 1. In this example, the apparatus is responsive to an applied force or an applied pressure and this in turn is used for the remote control of an external device. However, it should be appreciated that the techniques described herein are also applicable to the sensing of other physical attributes when a pair of electrodes made of electrically conductive traces are in contact with an active film.

In the application illustrated in FIG. 1, the apparatus may be designated as comprising force sensitive resistors. Force is detected in response to the movement of a user's thumb over an active surface 102.

FIG. 2

In the embodiment described with reference to FIG. 1, a plurality of detection elements 201, 202, 203 etc are included within an array 211. In this example, the array 211 consists of fifteen columns 212 and five rows 213. A first column connector 214 receives driving voltages from a processor and a first row connector 215 supplies scan voltages to the processor. Without the application of pressure or force, all of the detection elements within the array 211 remain non-conductive. However, when sufficient pressure is applied at the position of a particular detection element, that detection element does become conductive, thereby providing a transmission path between an input driving line and an output scanned line.

FIG. 3

Figure 2:
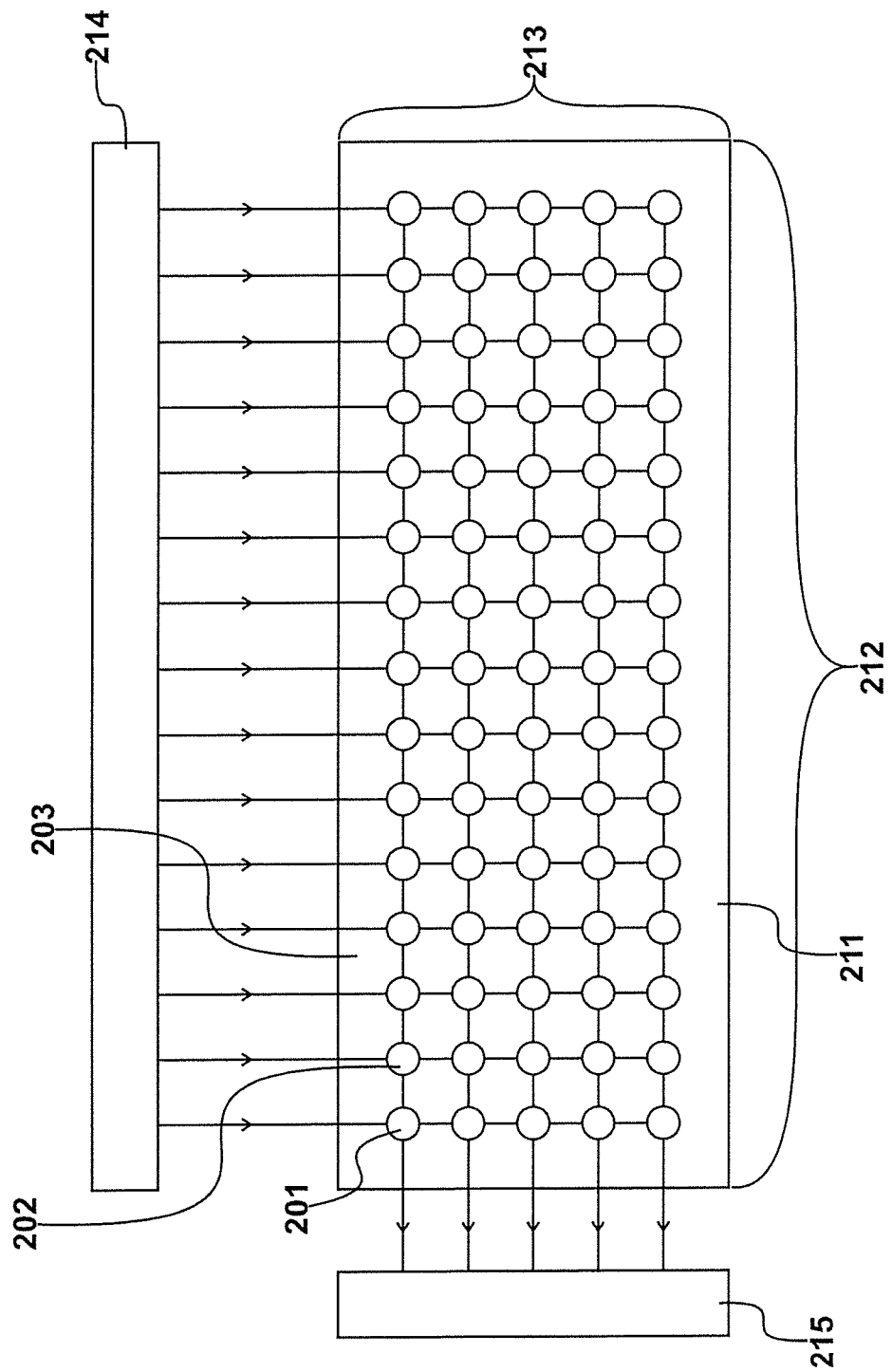
FIG. 2 shows detection-elements in an array.

An array of the type described with reference to FIG. 2, connects to a processing circuit of the type shown in FIG. 3. The first column connector 214 connects to a second column connector 301 and the first row connector 215 connects to a second row connector 302.

A processor, implemented as a microcontroller 303, performs a scanning operation that allows the detection elements 201, 202, 203 etc of the array 211 to be sequentially energized by a plurality of input lines 304. Furthermore, during energization of each input line, plural output lines 305 are sequentially monitored. In an alternative embodiment, one of the output lines 305 may be selected during which the input lines 304 are sequentially energized. In a further alternative embodiment, the energization and monitoring may take place substantially randomly provided that, within a particular cycle, all possible combinations have been considered.

In this embodiment, each output line includes a reference resistor such that, in this example, five output lines are present, resulting in the provision of a first reference resistor 311, a second reference resistor 312, a third reference resistor 313, a fourth reference resistor 314 and a fifth reference resistor 315. Thus, each respective reference resistor (311 to 315) produces a respective input voltage during each scanning cycle. Thus, in the configuration illustrated in FIG. 3, the variable resistive elements within array 211 are assembled as voltage dividers, using the external reference resistors 311 to 315.

FIG. 4

Figure 4:
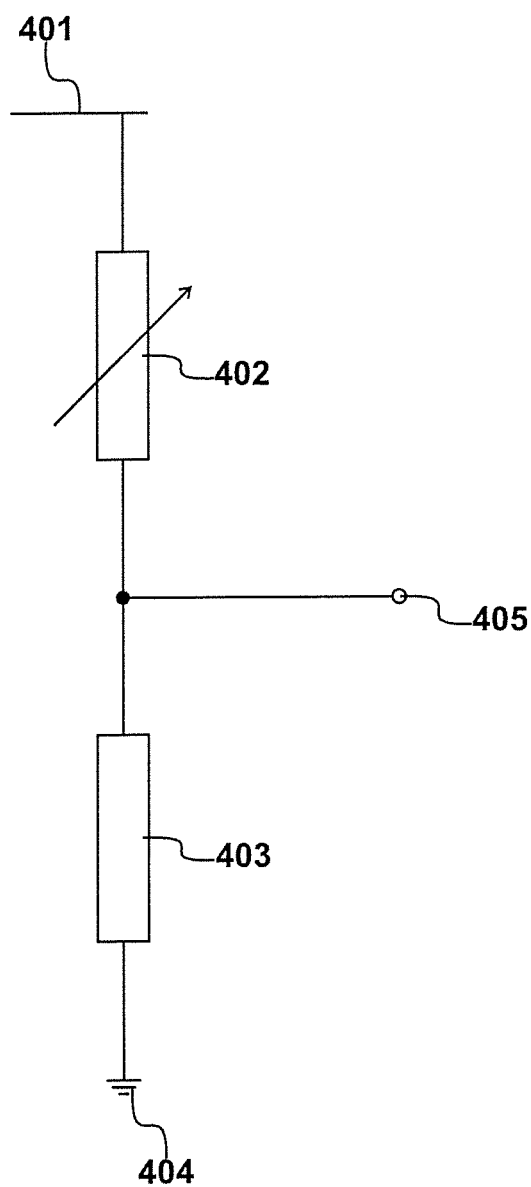
FIG. 4 shows an example of a voltage divider.

An example of a voltage divider configuration is shown schematically in FIG. 4. A DC voltage source is applied at an input terminal 401 which may be identified as the anode of a sensor element 402. The cathode of the detecting sensor element 402 connects to a reference resistor 403 which is in turn connected to earth 404. The reference resistor 403 performs the role of a current to voltage converter and could be replaced by other electrical arrangements performing a similar function. Thus, this allows an output voltage at output terminal 405 to be taken from the cathode of the sensor element 402.

Figure 3:
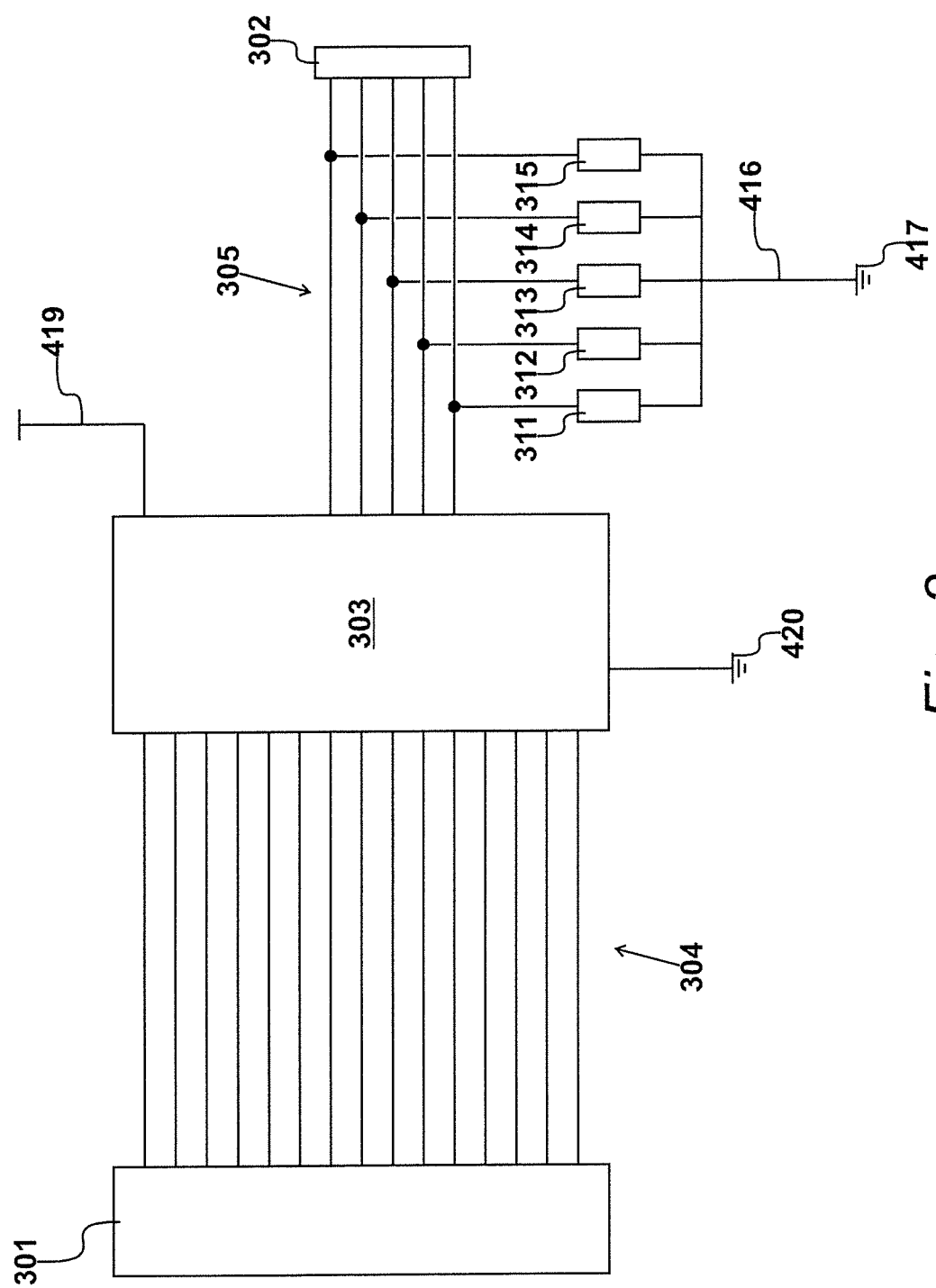
FIG. 3 shows the array of FIG. 2 connected to a processing circuit.

Implementing the functionality of the circuit shown in FIG. 4 in the environment illustrated in FIG. 3 requires the use of an external resistor (reference resistors 311 to 315) which adds to the cost of the device. Furthermore, the presence of these resistors also makes the apparatus susceptible to environmental conditions, such as temperature, which affect the voltage measured at output terminal 405 in the absence of any changes to the applied force or pressure. Thus, if accurate measurements are to be made in environments where changes of this type occur, a degree of external compensation is required.

FIG. 5

Figure 5:
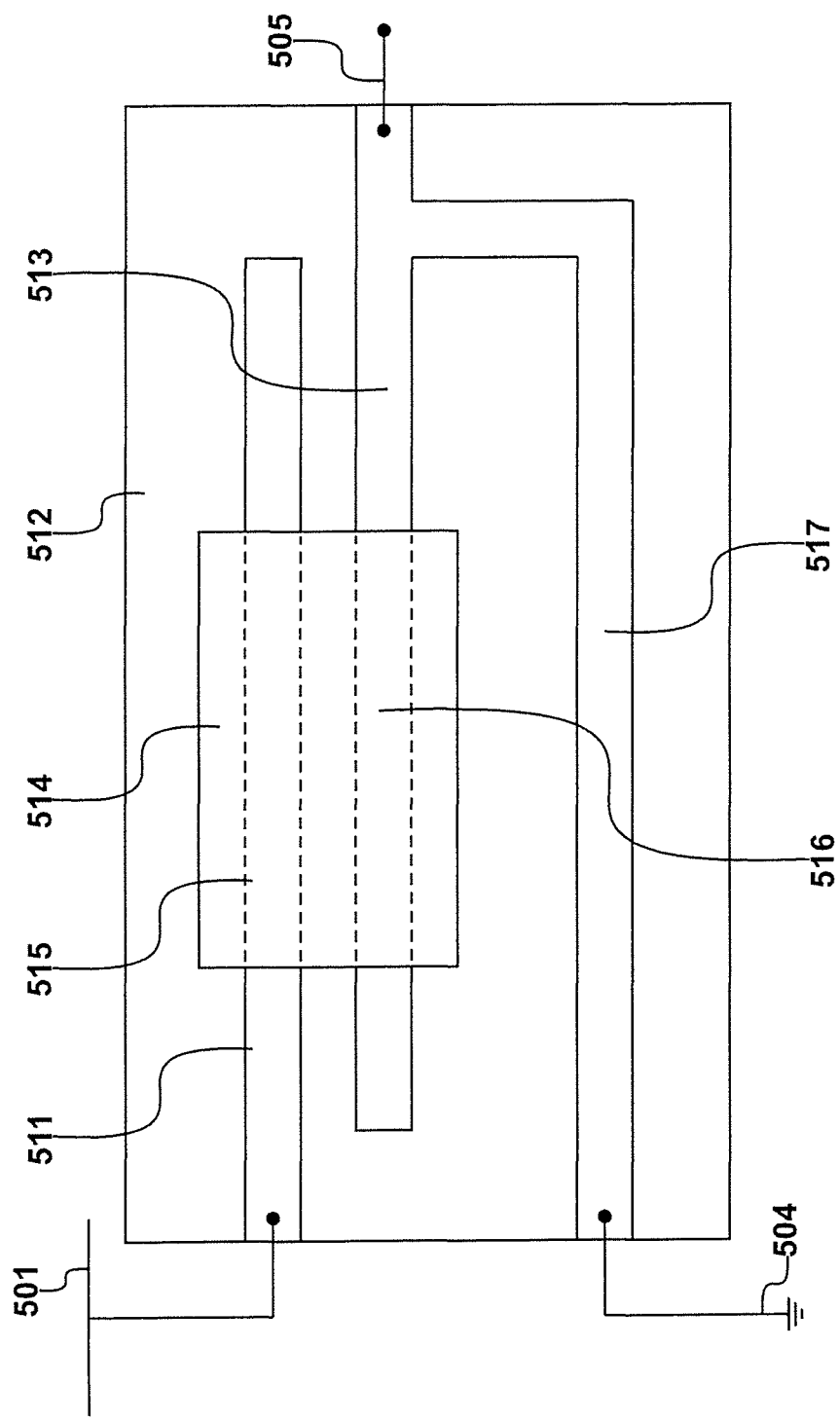
FIG. 5 shows a first embodiment of the present invention.

An embodiment of the present invention is illustrated in FIG. 5, that achieves the functionality of the circuit shown in FIG. 4, without the requirement for external resistors of the type illustrated in FIG. 3. An external voltage is applied to a supply line 501, a ground connection is made at a ground terminal 504 and an output is measured at an output terminal 505.

A first track 511 defines a first electrode on a substrate 512. A second track 513 defines a second electrode on the substrate 512. An active film 514 is in cooperation with a first sensor portion 515 of the first electrode 511 and a second sensor portion 516 of the second electrode 513.

In addition, the second electrode 513 includes a first extended portion 517 to establish a first additional resistance that is not cooperating with the active film 514. Thus, the invention modifies the electrode structure of the sensor by incorporating the reference resistor 403 into one of the electrodes of the sensor.

In an embodiment, the extended portion or reference resistor 517 is formed using the same material as the sensor electrodes and is patterned as an extension of one of the electrodes (electrode 513 in the embodiment of FIG. 5). A quantum tunneling compound (such as that available from the applicant under the trade mark QTC®) or a similar variable resistive material, defines a pattern that extends over the functional portions 515, 516 of the electrodes, but does not cover the reference resistor. Thus, in this embodiment, the sensor is a three terminal device that includes all of the elements of the voltage divider functionality described with reference to FIG. 4. Thus, the first additional resistance 517 may be configured to provide the reference resistor 403. In this configuration, when the second electrode 513 conducts current, the first additional resistance 517 provides a measurable voltage at output terminal 505.

FIG. 6

Figure 6:
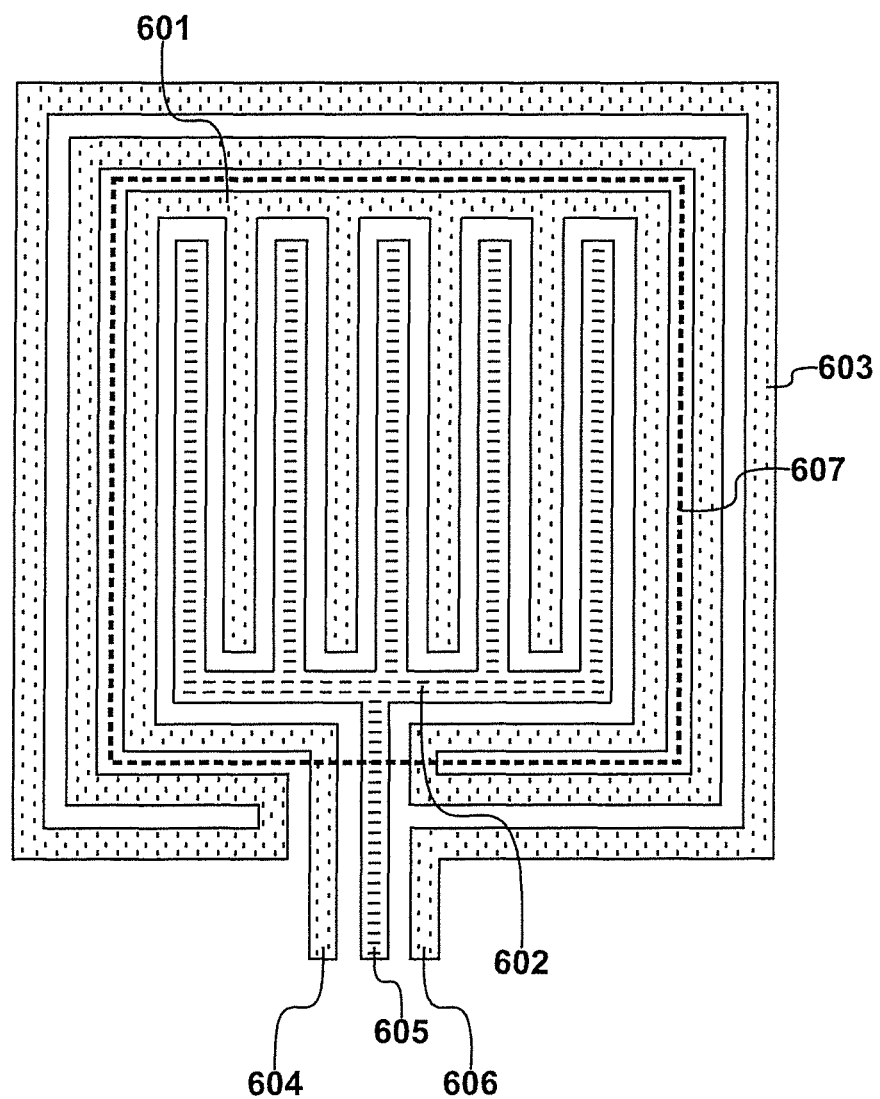
FIG. 6 shows a second embodiment of the present invention.

A second embodiment and a more sophisticated realization of the functionality described with reference to FIG. 5, is illustrated in FIG. 6. In this example, a first sensor portion 601 is interdigitated with a second sensor portion 602. Furthermore, an extended portion 603 surrounds the interdigitated first sensor portion 601 and the second sensor portion 602. The device has a first terminal 604, a second terminal 605 and a third terminal 606. The first terminal 604 provides the output signal and therefore, electrically, is equivalent to output 405 described with reference to FIG. 4. The supply voltage, identified as 401 in FIG. 4, is applied to the second terminal 605 and the third terminal 606 is grounded and is therefore equivalent to terminal 404. A second active film 607 is present, providing similar functionality to the active film 514 described with respect to FIG. 5.

Other patterns may be adopted, such as a straight segment, a serpentine or others and each may provide particular characteristics that are advantageous in some environments. In each of these deployments, the overall cost of construction is reduced because reference resistors have been included in the electrode layout, such that it is not necessary to include external resistive components. Furthermore, the configuration of FIG. 6 is particularly well adapted to compensating for other sources of variation, such as temperature variation. This is possible because the reference element is made of the same conductive material (carbon ink, metallic, organometallic or organic compound) as the interdigitated electrodes of the sensor. Consequently, variation of electrode resistance due to a change in an operating condition such as temperature, humidity or in-plane stress etc will affect both the reference resistance and the sensor electrodes.

FIG. 7

Figure 7:
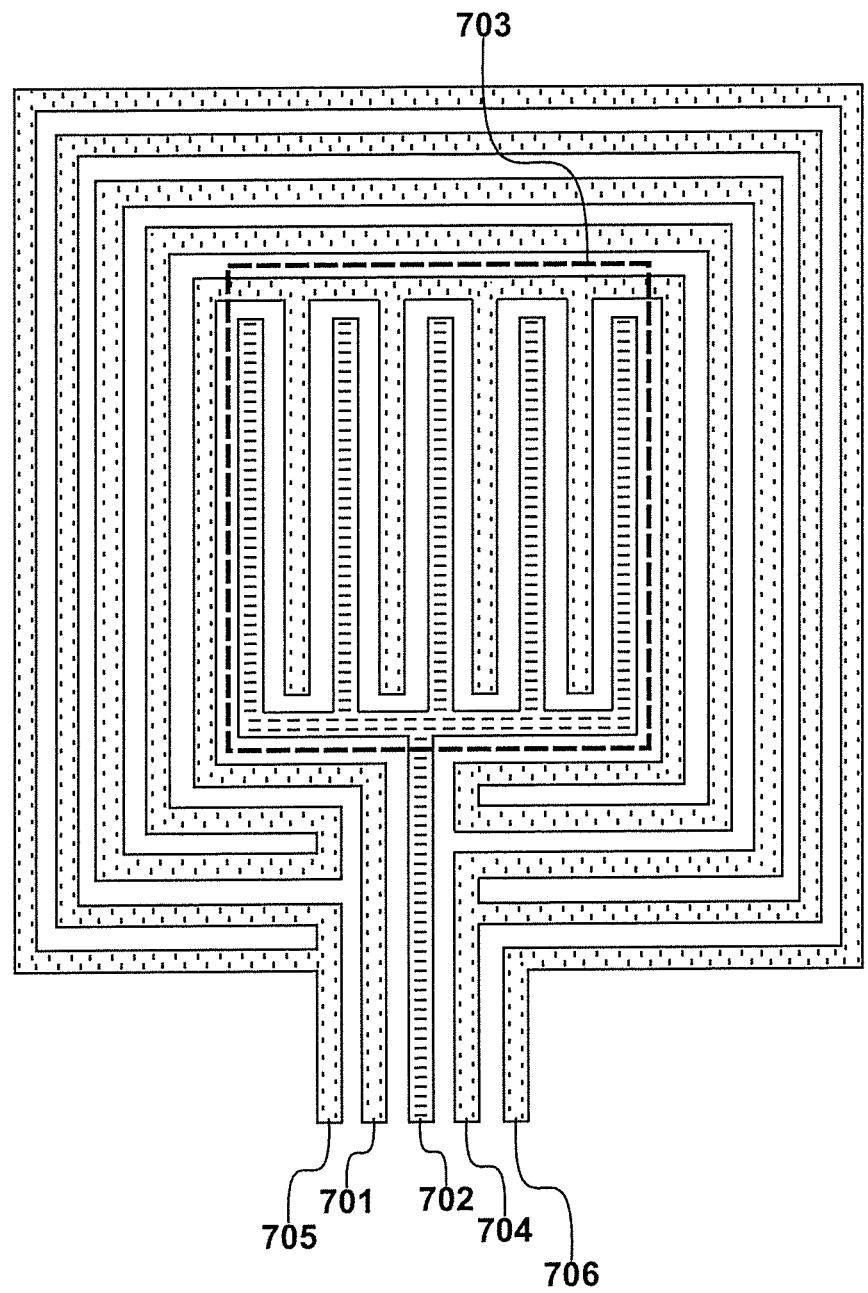
FIG. 7 shows a third embodiment of the present invention.

A further embodiment is illustrated in FIG. 7. In the embodiment of FIG. 7, a first track 701 extends to define a first electrode on the substrate and a second track 702 defines a similar second electrode on the substrate, such that these electrodes have sensor portions that cooperate with an active film 703.

The second electrode includes a first extended portion to establish a first additional resistance which in turn emerges as a track at 704. The apparatus further comprises a second extended portion 705 and a third extended portion 706, wherein the interdigitated portion defining a variable resistance are combined with the first additional resistance, a second additional resistance defined by the second extended portion and a third additional resistance defined by the third extended portion in a bridge configuration.

FIG. 8

Figure 8:
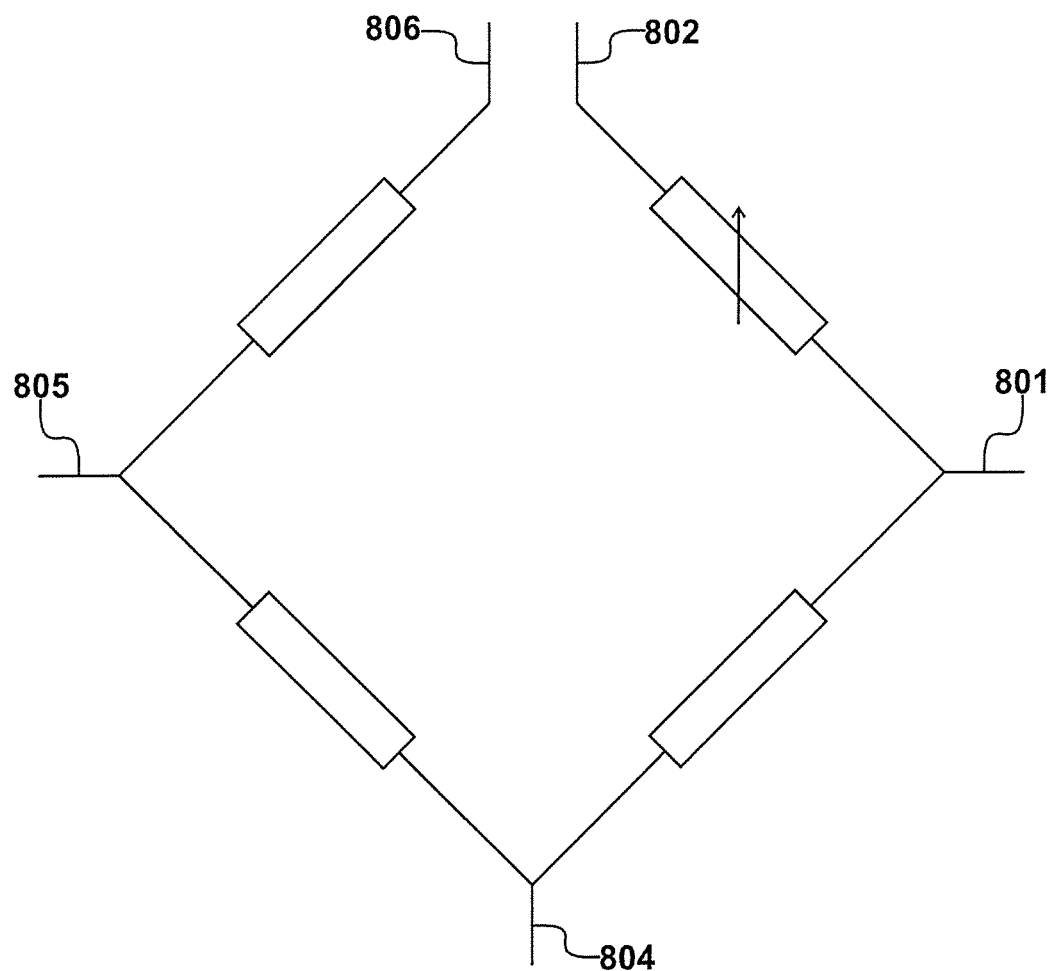
FIG. 8 shows a schematic representation of the third embodiment.

A schematic representation of the bridge configuration established by the embodiment described with reference to FIG. 7, is shown in FIG. 8. The apparatus described with reference to FIG. 7 presents five external terminals, identified as terminals 701, 702, 704, 705 and 706. These are identified by equivalent terminals in FIG. 8, referenced 801, 802, 804, 805 and 806 respectively.

Experiments have shown that the configuration described with reference to FIG. 7 allows accurate measurement of pressure/force to be determined over a wide range of operating temperatures, while providing inherent compensation for temperature fluctuation without impinging upon the accuracy of measurements taken for the attribute (force/pressure) under consideration.

The invention claimed is:

1. An apparatus for sensing a physical attribute, comprising:
   a first track defining a first electrode on a substrate;
   a second track defining a second electrode on said substrate; and an active film comprising a variable resistance material in cooperation with a first sensor portion of said first electrode and a second sensor portion of said second electrode, wherein:

said second electrode includes a first extended portion to establish a first additional resistance not cooperating with said active film; and said first sensor portion, said second sensor portion and said first extended portion comprise the same conductive material.

2. The apparatus of claim 1, wherein said first additional resistance is configured to provide a reference resistor.

3. The apparatus of claim 2, wherein said reference resistor is configured to provide a measurable voltage when said second electrode is conducting current.

4. The apparatus of claim 1, wherein said first sensor portion is interdigitated with said second sensor portion.

5. The apparatus of claim 4, wherein said extended portion surrounds said interdigitated first sensor portion and said second sensor portion.

6. The apparatus of claim 4, further comprising a second extended portion and a third extended portion, wherein said interdigitated portions defining a variable resistance are combined with said first additional resistance, a second additional resistance defined by said second extended portion and a third additional resistance defined by said third extended portion in a bridge configuration.

7. The apparatus of claim 1, wherein said physical attribute is applied force.

8. The apparatus of claim 1, wherein said attribute is applied pressure.

9. The apparatus of claim 1, wherein said first extended portion is configured to facilitate compensation against fluctuations in an ambient condition.

10. The apparatus of claim 9, wherein said ambient condition is temperature.

11. A method of constructing an apparatus for sensing a physical attribute, comprising the steps of:

defining a first electrode on a substrate;

further defining a second electrode on said substrate;

arranging an active film comprising a variable resistance material to cooperate with a first sensor portion of said first electrode and a second sensor portion of said second electrode; and establishing a first additional resistance in an extended portion of said first electrode;

wherein said first sensor portion, said second sensor portion and said first extended portion comprise the same conductive material.

12. The method of claim 11, further comprising the step of configuring said first additional resistance to provide a reference resistor.

13. The method of claim 12, further comprising the step of further configuring said reference resistor to provide a measurable voltage when said second electrode is conducting current.

14. The method of claim 11, further comprising the step of interdigitating first elements of said first electrode with second elements of said second electrode.

15. The method of claim 14, further comprising the step of surrounding said first elements and said second elements with said extended portion.

16. A method of sensing a physical attribute, comprising the steps of:

exposing a sensor portion of cooperating electrodes to said physical attribute, in which variable current flows through said cooperating electrodes; and measuring a voltage with respect to a reference resistance, wherein said reference resistance is established as a first additional resistance in one of said cooperating electrodes, said sensor portion and said first additional resistance comprise the same conductive material.

17. The method of claim 16, wherein said physical attribute is force.

18. The method of claim 16, wherein said physical attribute is pressure.

19. The method of claim 17 wherein force or pressure is applied as a result of a manual interaction.

20. The method of claim 19, wherein said manual interaction involves an application of a user's finger.

* * * * *